United States Patent
Komatsu et al.

(10) Patent No.: US 7,262,617 B2
(45) Date of Patent: Aug. 28, 2007

(54) METHOD FOR TESTING INTEGRATED CIRCUIT, AND WAFER

(75) Inventors: Kenji Komatsu, Sendai (JP); Akira Nakajo, Sendai (JP)

(73) Assignee: Freescale Semiconductor Inc., Austin, TX (US)

( * ) Notice: Subject to any disclaimer, the term of this patent is extended or adjusted under 35 U.S.C. 154(b) by 0 days.

(21) Appl. No.: 11/493,424

(22) Filed: Jul. 26, 2006

(65) Prior Publication Data

US 2007/0024300 A1   Feb. 1, 2007

(30) Foreign Application Priority Data

Jul. 26, 2005   (JP)   ............... 2005-215993

(51) Int. Cl.
*G01G 31/02* (2006.01)
(52) U.S. Cl. .................................... 324/758
(58) Field of Classification Search ............... 324/465, 324/754, 756–758; 257/459, 676, 779–785
See application file for complete search history.

(56) References Cited

U.S. PATENT DOCUMENTS

| | | | | |
|---|---|---|---|---|
| 2,743,201 A | * | 4/1956 | Johnson et al. ............ 438/352 |
| 4,929,893 A | * | 5/1990 | Sato et al. .................. 324/758 |
| 2003/0080764 A1 | * | 5/2003 | Zhou et al. ................. 324/758 |
| 2003/0085723 A1 | * | 5/2003 | Martens et al. ............. 324/754 |
| 2004/0032279 A1 | * | 2/2004 | Ishio et al. ................. 324/765 |
| 2005/0116729 A1 | * | 6/2005 | Koester et al. ............. 324/754 |
| 2005/0129385 A1 | | 6/2005 | Speasl et al. |

FOREIGN PATENT DOCUMENTS

JP   8-306751   11/1996

* cited by examiner

*Primary Examiner*—Ha Tran Nguyen
*Assistant Examiner*—Joshua Benitez
(74) *Attorney, Agent, or Firm*—Charles Bergere

(57) ABSTRACT

A method for manufacturing an integrated circuit, a measurement apparatus of an integrated circuit, and a wafer that reduces damages inflicted on bonding pads while enabling a probe test to be accurately performed. A sensor cell is arranged on a wafer between chip formation regions. The sensor cell has a diaphragm. Sensor pads, connected to a doping region, are arranged on the surface of the diaphragm. Probe needles contact the sensor pads. This strains the doping region and produces a corresponding voltage measured by the probe needles connected to the sensor pads. Relative inclination angle and relative distance of a probe card, which includes the probe needles, and the wafer are determined based on the measured voltage. A conduction test is performed by having the probe needles contact the bonding pad of the wafer while maintaining the determined the relative position.

13 Claims, 3 Drawing Sheets

METHOD FOR TESTING INTEGRATED CIRCUIT, AND WAFER

BACKGROUND OF THE ART

The present invention relates to a method for manufacturing an integrated circuit, a measurement apparatus for an integrated circuit, and a wafer.

Presently, integrated circuits are used in a variety of applications. In order to improve the productivity of integrated circuits, a plurality of integrated circuit chips are simultaneously manufactured on a single wafer. More specifically, devices and wiring patterns for a plurality of integrated circuits are formed on a wafer. Then, a dicing process is performed to divide the wafer into a plurality of chips to form the integrated circuits. Before dividing the wafer into chips, each integrated circuit undergoes a conduction test, which is referred to as a probe test.

A typical probe test is conducted by pressing a probe needle against a bonding pad of the chip so as to test the operation of the chip. Contact between the probe needle and the bonding pad must be ensured during the probe test to reduce contact resistance between the bonding pad and the probe needle. However, the bonding pad may be damaged if the probe needle is pressed too hard against the bonding pad. Therefore, research has been carried out to develop a method for manufacturing a semiconductor that avoids damaging of the bonding pad during the probe test (refer to, for example, Japanese Laid-Open Patent Publication No. 8-306751).

In the invention described in Japanese Laid-Open Patent Publication No. 8-306751, a probe pad is arranged in a region between chips along a scribe line. The probe pad is connected to a bonding pad by a wire. A probe needle is pressed against the probe pad to conduct the probe test through the bonding pad. This prevents the bonding pad of the chip from being damaged even if the pressure of the probe needle damages the probe pad.

However, in the invention of Japanese Laid-Open Patent Publication No. 8-306751, the probe pad is connected to the bonding pad by a wire. Therefore, capacitance generated between the substrate and a wire or bonding pad may interfere and lower measurement accuracy. The influence of such capacitance is particularly prominent when conducting a probe test with high-frequency waves.

SUMMARY OF THE INVENTION

It is an object of the present invention to provide a method for manufacturing an integrated circuit, a measurement apparatus, and a wafer that enables a probe test to be conducted with higher accuracy, while reducing damages inflicted to bonding pads.

One aspect of the present invention is a method for manufacturing an integrated circuit, formed by a chip including a bonding pad, on a wafer. The method includes arranging a sensor pad on the wafer to measure pressure applied by a probe needle that conducts a probe test, pressing the probe needle against the sensor pad to measure change in the pressure with the sensor pad, adjusting relative position of the probe needle and the wafer based on the change in the pressure, and conducting the probe test by having the probe needle contact the bonding pad at the relative position.

Another aspect of the present invention is a measurement apparatus for an integrated circuit. The measurement apparatus includes a probe needle for conducting a probe test on a wafer including a plurality of chips, each having a bonding pad. An adjustment means adjusts relative position of the wafer and the probe needle. A determination means determines the relative position of the wafer and the probe based on a specific electric change corresponding to change in pressure applied by the probe needle to a sensor pad arranged on the wafer. A positional control means has the probe needle contact the bonding pad at the relative position determined by the determination means.

A further aspect of the present invention is a wafer including a plurality of chips, each having a bonding pad. The wafer includes a sensor pad for measuring pressure applied by a probe needle that conducts a probe test by contacting the bonding pad.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
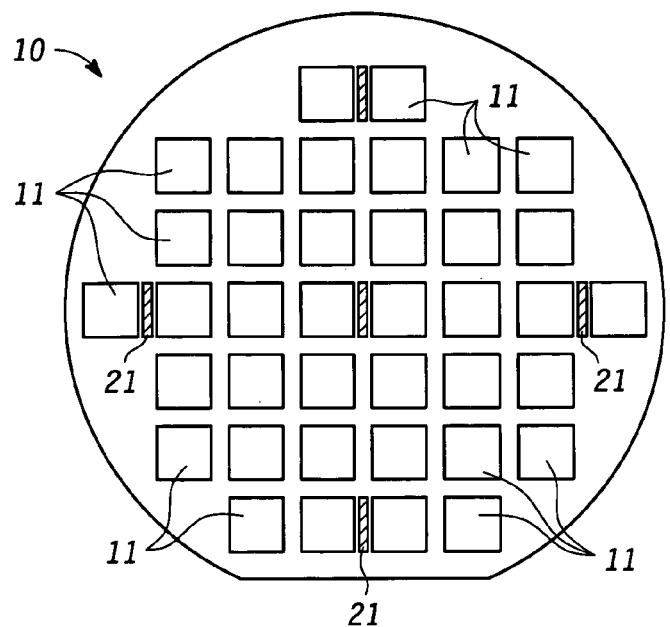
FIG. 1 is a plan view showing a wafer according a preferred embodiment of the present invention.

A preferred embodiment of the present invention will now be described with reference to FIGS. 1 to 4. As shown in FIG. 1, a wafer 10 includes a plurality of chip formation regions 11, which form integrated circuit chips when the wafer is divided. The same integrated circuit wiring pattern is formed in the chip formation regions 11. In the same manner as known chips, a plurality of bonding pads are formed on the peripheral portion of each chip formation region 11.

A plurality of sensor cells 21 are spread out on the wafer 10. In the preferred embodiment, the sensor cells 21 are arranged outside the chip formation regions 11. In the preferred embodiment, the sensor cells 21 are arranged in regions, or along scribe lines, that are cut when the dicing process is performed.

Figure 2A:
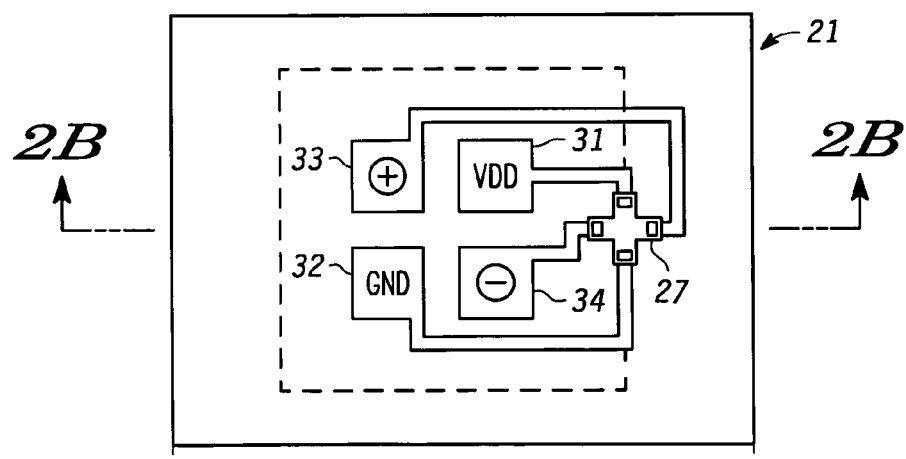
FIG. 2A is a schematic diagram showing the configuration of a sensor cell.
Figure 2B:
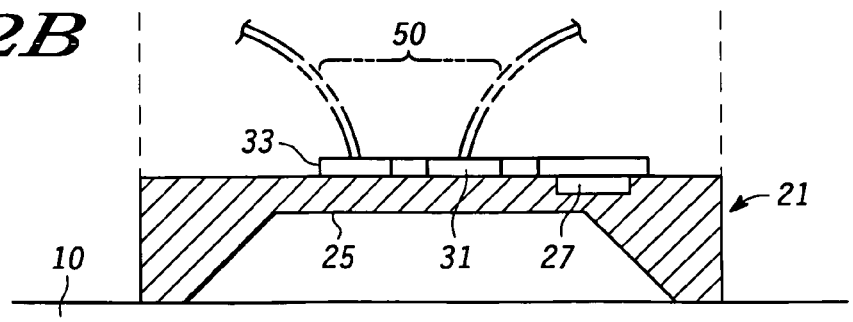
FIG. 2B is a cross-sectional view taken along the line 2B-2B of FIG. 2A.

Each of the sensor cells 21 is a Micro Electro Mechanical System (MEMS). Referring to FIG. 2B, a diaphragm 25 is first formed. A doping region 27 is formed near one end of the upper surface of the diaphragm 25, as viewed in FIG. 2B. Impurities of a conductivity type differing from that of the substrate are injected in the doping region 27 to form a piezoresistive measurement region. In the preferred embodiment, the doping region 27 is substantially cross-shape as shown in FIG. 2A and is a so-called X-ducer piezoresistor (sensor portion).

Figure 3:
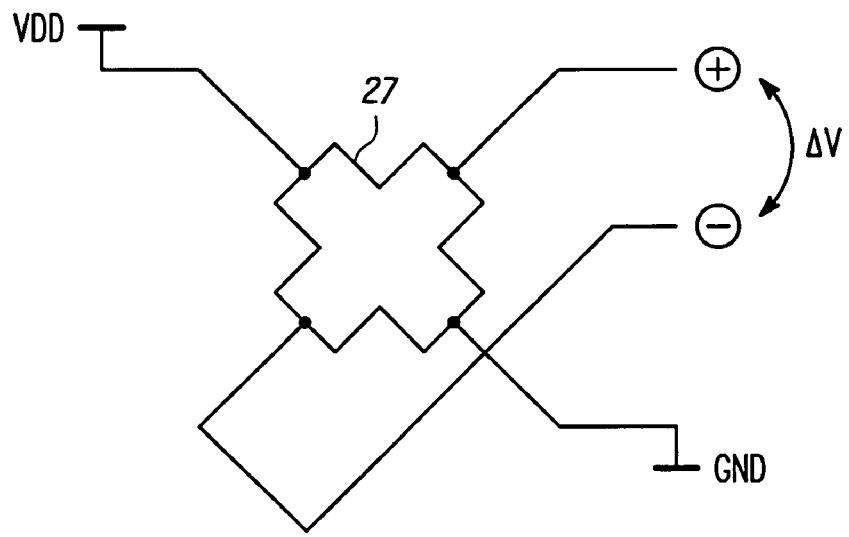
FIG. 3 is a wiring diagram illustrating the electric connection of a piezoresistor.

Four sensor pads 31, 32, 33, and 34 are formed in the middle part of the surface of the diaphragm 25 in the sensor cell 21. The sensor pad 31 is an electrode pad for application of power supply voltage VDD. The sensor pad 32 is an electrode pad connected to ground (GND). The sensor pads 33 and 34 each define a voltage measurement portion and are respectively positive and negative electrode pads. The sensor pads 31 to 34 are connected associated end portions of the doping region 27. As shown in FIG. 3, in the doping region 27, the power supply voltage VDD and the ground GND are opposed to each other, and the positive and negative electrodes of the voltage measurement portion are opposed to each other.

Figure 4:
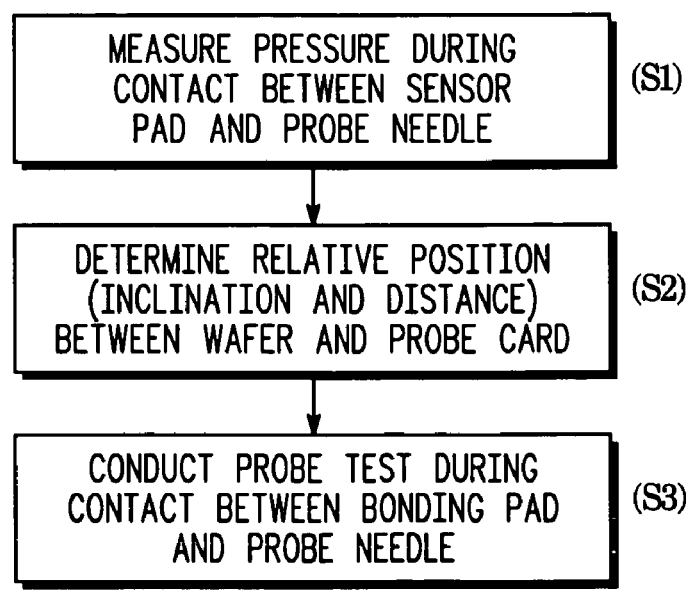
FIG. 4 is a flowchart showing procedures for manufacturing an integrated circuit.

The procedures for manufacturing an integrated circuit will now be described with reference to FIG. 4.

After completion of the wiring pattern, the wafer 10 is mounted on a known test station (not shown). A known probe card provided with a plurality of probe needles is arranged above the test station. The test station is a mechanism for adjusting the relative position, including the relative inclination angle, of the wafer to the probe card.

The probe card, which measures pressure, first contacts the wafer that is subjected to measurement. The probe card includes probe needles 50 associated with the sensor cells 21. The pressure applied by each of the probe needles is sequentially measured (step S1). More specifically, probe needles 50 are connected to the sensor pads 31 to 34 of the sensor cell 21, with the distance between the probe card and the wafer 10 being set in accordance with a predetermined initial value. The application of a large pressure to the wafer 10 by the probe needle 50 will deflect the diaphragm 25 of the sensor cell 21. This will produce strain in the diaphragm 25 and change the resistance of the doping region 27. As a result, this would change the voltage between the sensor pads (33 and 34). Such voltage change is detected by the probe needles 50. Accordingly, the pressure applied by the probe needles 50 to the wafer 10 in the sensor cell 21 is measured. The pressure applied by the probe needles 50 in other sensor cells 21 is measured in the same manner when the probe needles 50 contact the sensor pads 31 to 34.

Then, the position (inclination angle and relative distance) of the probe card relative to the wafer 10 is determined based on the pressure measured in each sensor cells 21 (step S2). More specifically, information related to absolute values and distribution of pressures is obtained from the resistance values measured in the doping regions 27. The relative position, including the relative inclination angle of the wafer 10, is adjusted based on such information. More specifically, differences in pressure and absolute values of pressure in the wafer surface are adjusted to be within a predetermined reference range. The reference range is a range ensuring sufficient probe contact without damaging the pads.

A conduction test (probe test) is conducted when the probe needles 50 contact the bonding pads of the chips in accordance with the relative position of the probe card and the wafer 10 determined in step S2 (step S3).

The preferred embodiment has the advantages described below.

In the preferred embodiment, the probe needles 50 contact the sensor pads 31 to 34 of the sensor cells 21 on the wafer 10 before conducting the probe test. The pressure applied by the probe needles 50 to the sensor pads 31 to 34 is measured based on the changes in resistance of the doping region 27. The relative positions of the probe needles 50 and the wafer 10 is then determined based on the measurement result. A conduction test is conducted with the probe needles 50 contacting the bonding pads of the chips at the determined relative positions. The pressure applied by the probe needles 50 when contacting the sensor pads of the sensor cell 21 is measured to adjust the pressure applied by the probe needles 50 when contacting the bonding pads of the chip. This enables the probe needles 50 to contact the bonding pads with optimal pressure and reduces damages inflicted on the bonding pads.

Further, the conduction test is conducted with the probe needles 50 directly contacting the bonding pads. Therefore, the conduction test of integrated circuits formed on chip is conducted with higher reliability.

Additionally, the pressure of the probe needles 50 is measured by using the sensor pads 31 to 34, which are formed in the wafer with the bonding pads subjected to the conduction test. Further, the probe needles 50 contact the sensor pads when measuring the pressure. Thus, the pressure is measured in a state reflecting the condition in which the probe needles 50 are in contact with the wafer 10. Therefore, the pressure is measured in the same condition as when the probe needles 50 contact the bonding pads. Furthermore, the relative position is adjusted in accordance with the measured pressure. This optimally adjusts the relative position in an automated manner even if wafers have manufacturing errors.

In the preferred embodiment, the relative inclination angle and the relative distance of the wafer 10 and the probe card, which includes the probe needles 50, are adjusted in accordance with the measured pressures of the probe needles 50. Therefore, the conduction test is conducted by having the probe needles 50 contact the bonding pads with an appropriate pressure throughout the entire wafer 10.

In the preferred embodiment, the sensor cells 21 are spread out and located at a plurality of positions on the wafer 10. Therefore, the relative position of the probe card and the wafer 10 is further optimally adjusted throughout the entire surface of the wafer 10 based on the measured pressure of each sensor cell 21.

In the preferred embodiment, the sensor pads 31 to 34 are arranged in the middle portion of the surface of the diaphragm 25, and the doping region 27 is formed at the end portion in the surface of the diaphragm 25. Therefore, the resistance data is obtained in accordance with the pressure applied by the probe needles 50 during contact with the sensor pads 31 and 34. Accordingly, the relative position is determined based on the pressure of the probe needles 50. Thus, the probe needles 50 contact the bonding pads with further optimal pressure.

In the preferred embodiment, the sensor cells 21 are arranged between the chip formation regions 11. Therefore, the sensor cells 21 do not hinder the formation of chips on the wafer 10. This increases the productivity of the chips.

It should be apparent to those skilled in the art that the present invention may be embodied in many other specific forms without departing from the spirit or scope of the invention. Particularly, it should be understood that the present invention may be embodied in the following forms.

In the preferred embodiment, the doping region 27 is arranged at an end portion of the diaphragm 25. However, as long as the pressure can be measured, the doping region 27 may be arranged in other parts of the diaphragm 25, such as in the middle of the diaphragm 25. Also, the sensor pads 31 to 34 do not have to be laid out in the same manner as in the preferred embodiment. For example, the sensor pads 31 to 34 may be arranged on opposite sides of a connector connected to the doping region 27.

In the preferred embodiment, the relative inclination angle and the relative distance of the wafer 10 and the probe needle 50 are adjusted as the relative position. However, only one of the relative inclination angle and the relative distance may be adjusted as the relative position.

In the preferred embodiment, the doping region 27 is used for measuring pressure. However, as long as pressure can be measured, any type of pressure sensor may be used to measure the pressure of the probe needles 50. For example, a variable capacitance type sensor element including a metal layer and a dielectric film layer may be used.

Figure 5:
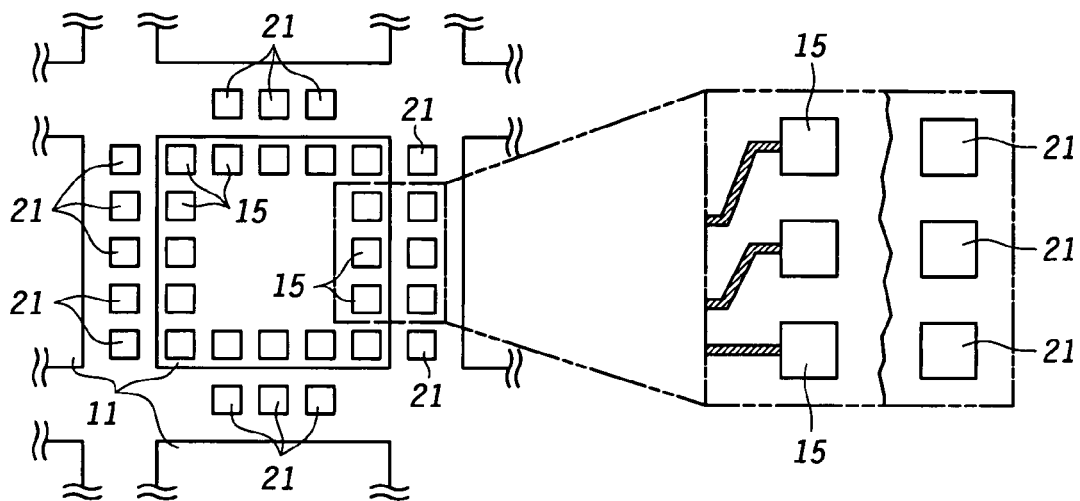
FIG. 5 is a front view showing a first modification of a wafer.

In the preferred embodiment, a plurality of sensor cells 21 are arranged on the wafer 10. Instead, the sensor cells 21 may be arranged near the bonding pads 15, as shown in FIG. 5. In this case, the sensor pads 31 to 34 of each sensor cells 21 are laid out so as the enable measurement of the pressure applied to the associated bonding pad 15 and determine the pressure of each bonding pad 15. Accordingly, the pressures of the probe needles 50 applied to the bonding pads 15 are adjusted further optimally so that the damages inflicted on the bonding pads 15 are further reduced.

Figure 6:
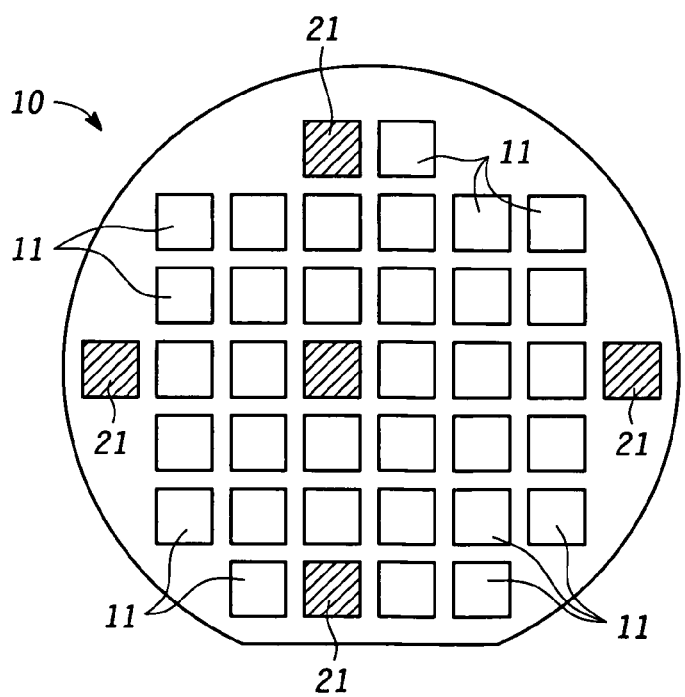
FIG. 6 is a front view showing a second modification of a wafer.

In the preferred embodiment, the sensor cells 21 are arranged on the scribe lines between the chip formation regions 11. Instead, if the sensor cells 21 are enlarged, the sensor cells 21 may be arranged in the chip formation regions 11 of the wafer 10, as shown in FIG. 6. In this case, the pressures applied by the probe needles 50 to the bonding pads are also adjusted with the sensor cells 21. This reduces the damages inflicted on the bonding pads and improves yield.

The present examples and embodiments are to be considered as illustrative and not restrictive, and the invention is not to be limited to the details given herein, but may be modified within the scope and equivalence of the appended claims.

What is claimed is:

1. A method for testing an integrated circuit, formed on a chip and including a bonding pad, on a wafer, the method comprising:
   arranging a sensor cell on the wafer;
   pressing a probe needle against the sensor cell to measure a change in pressure with the sensor cell;
   adjusting a relative position of the probe needle and the wafer based on the change in the pressure; and
   conducting a probe test by having the probe needle contact the bonding pad at the relative position.

2. The method according to claim 1, wherein the sensor cell is one of a plurality of sensor cells spread out on the wafer, and the relative position of the probe needle to the wafer is adjusted by adjusting at least one of relative inclination angle and relative distance of a probe card, which includes the probe needle, and the wafer.

3. The method according to claim 1, wherein the sensor cell is arranged on the wafer outside a region in which the chip is formed.

4. A wafer including a plurality of chips, each chip having a bonding pad, the wafer comprising:
   a sensor cell for measuring pressure applied by a probe needle that conducts a probe test by contacting a chip bonding pad.

5. The wafer of claim 4, wherein the wafer includes a plurality of the sensor cells disposed on the wafer.

6. The wafer of claim 5, wherein the wafer includes a plurality of scribe lines used during a cutting operation to separate the chips, wherein the sensor cells are located along the scribe lines.

7. The wafer of claim 5, wherein there are more chips than sensor cells formed on the wafer.

8. The wafer of claim 4, wherein the sensor cell comprises a Micro Electrical Mechanical System (MEMS) type device.

9. The wafer of claim 8, wherein the sensor cell includes a diaphragm and a doping region formed near one end of an upper surface of the diaphragm.

10. The wafer of claim 9, wherein impurities are injected into the doping region.

11. The wafer of claim 9, wherein the doping region is substantially cross-shaped.

12. The wafer of claim 9, wherein the sensor cell includes four sensor pads.

13. The wafer of claim 12, wherein the four sensor pads include a first electrode pad for application of a power supply voltage (Vdd), a second electrode pad connected to ground, a positive electrode pad, and a negative electrode pad.

* * * * *